(12) United States Patent
Ausserlechner et al.

(10) Patent No.: US 6,559,721 B2
(45) Date of Patent: May 6, 2003

(54) CIRCUIT CONFIGURATION WITH AN INTEGRATED AMPLIFIER

(75) Inventors: Udo Ausserlechner, Villach (AT); Mario Motz, Wernberg (AT)

(73) Assignee: Infineon Technologies AG, Munich (DE)

(*) Notice: Subject to any disclaimer, the term of this patent is extended or adjusted under 35 U.S.C. 154(b) by 0 days.

(21) Appl. No.: 10/014,001

(22) Filed: Dec. 11, 2001

(65) Prior Publication Data

US 2002/0070805 A1 Jun. 13, 2002

(30) Foreign Application Priority Data

Dec. 11, 2000 (DE) .......................................... 100 61 589

(51) Int. Cl.[7] .............................. H03F 3/18; H03F 1/14
(52) U.S. Cl. ......................................... 330/264; 330/51
(58) Field of Search .............................. 330/51, 207 A, 330/251, 255, 264, 307

(56) References Cited

U.S. PATENT DOCUMENTS 5,329,246 A * 7/1994 Mahabadi ............... 330/264 X

FOREIGN PATENT DOCUMENTS

DE  44 00 437 A1  7/1994

* cited by examiner

*Primary Examiner*—Steven J. Mottola
(74) *Attorney, Agent, or Firm*—Laurence A. Greenberg; Werner H. Stemer; Gregory L. Maybeck

(57) ABSTRACT

A circuit configuration with an integrated amplifier is described. The amplifier has an output stage that is connected to a supply potential terminal and a reference potential terminal. A pair of complementary output transistors couples the amplifier with a tri-state output. Given an interruption of an operating-current supply that is connectible to the reference and supply potential terminals, the tri-state output is put into a high-impedance state by the circuit configuration. To this end, two blocking transistors are provided, which can be supplied by respective charge pump circuits. For instance, for sensor applications in which a high operational reliability is required, the present circuit configuration prevents the misinterpretation of measurement results given disturbances, for a small outlay.

12 Claims, 5 Drawing Sheets

CIRCUIT CONFIGURATION WITH AN INTEGRATED AMPLIFIER

BACKGROUND OF THE INVENTION

1. Field of the Invention

The present invention relates to a circuit configuration with an integrated amplifier.

For example, it is common in sensor technology to capture a measuring signal in a remote sensor, amplify it and transmit it over a transmission line to evaluating electronics, which can be centrally disposed. It is also customary therein for the sensor to receive its operating voltage from the central unit, likewise over lines.

It may be desirable, for instance for reasons of operational reliability, to be able to detect an interruption of a supply line from the central unit to the remote sensor with the aid of the measuring signal, for instance in the central unit. Otherwise, given an error in the supplying of the sensor, it could provide a signal that could be misinterpreted as a measured signal.

A known technique given an interruption, for instance a break of a supply line, is to create a low-impedance connection from the output terminal of the sensor, which can provide a measuring signal, to the supply voltage terminals at the sensor. Thus, in the central unit it is possible to detect a failure in that the potential of the output signal is above an upper potential limit or below a lower potential limit that typically occur in normal operation.

Published, Non-Prosecuted German Patent Application DE 44 00 437 A1 describes a semiconductor sensor device. There, given an interruption of a voltage supply terminal, a value outside a predefined range is outputted at the output by a clipper.

2. Summary of the Invention

It is accordingly an object of the invention to provide a circuit configuration with an integrated amplifier which overcomes the above-mentioned disadvantages of the prior art devices of this general type, which makes possible, in a simple and reliable fashion, the detection of a failure such as an interruption of a supply voltage supplying the circuit configuration.

With the foregoing and other objects in view there is provided, in accordance with the invention, a circuit configuration. The circuit has an integrated amplifier with a symmetrical amplifier output, a supply potential terminal to be coupled to a voltage source for supplying an operating current, a reference potential terminal to be coupled to the voltage source, a tri-state output, and an output stage having a pair of complementary output transistors with control inputs connected to the symmetrical amplifier output. The pair of complementary output transistors includes a first output transistor having a controlled path coupling the supply potential terminal to the tri-state output, and a second output transistor having a controlled path coupling the tri-state output to the reference potential terminal. The output stage further has switches coupling the first and second output transistors with the tri-state output so that the tri-state output is put into a high-impedance state given an interruption of the operating current.

To couple the output transistors with the tri-state output, a blocking circuit can be provided, which is driven by a driver circuit, which is connected to the reference and supply potential terminals for its current supply. During normal operation, the blocking circuit can effectuate a low-impedance coupling of the output transistors with the tri-state output. But if a disturbance such as an interruption of the current supply occurs, then a high-impedance coupling of the output transistors with the tri-state output is effectuated with the aid of the driver circuit.

The input of the amplifier can be connected to the output of a sensor.

The circuit configuration can be coupled with a voltage source, which can be connected by lines.

The amplifier output can be laid out symmetrically, i.e. for conducting a difference signal. Such a difference signal is customarily carried on two lines.

During normal operation of the circuit configuration, the output stage at the tri-state output can provide a digital signal or an analog signal at its output, depending on the signal on the input side, for instance the measuring signals of a sensor. The digital signal can be a binary signal, which can have two states, low and high. The logic states are customarily coded by respective voltage values or voltage ranges.

In the normal operation of the circuit configuration, the signal levels that can arise are within a defined range, which can have lower and upper limits.

The normal operation of the circuit configuration is interrupted by the interruption of the operating-current supply, for example. In this case, in the described circuit configuration the tri-state output is put into a high-impedance state. This can be easily detected in that the signal available at the tri-state output, with respect to its voltage level or potential, is above an upper voltage or below a lower voltage occurring in normal operation. In order to accomplish this, a load resistance can be connected to the tri-state output. The load resistance can be connected to the tri-state output via one terminal and to a reference or supply potential terminal via another terminal. This is of course predicated on the condition that the tri-state output has a substantially higher-impedance than the load resistance connected to it.

If the load resistance is connected to the reference potential terminal with its additional terminal, it draws the tri-state output to the reference potential given an interruption of the operating-current supply. The load instance can be referred to as a pull-down load instance. If, on the other hand, the load resistance is connected between the supply potential terminal and the tri-state output, then given an interruption of the operating-current supply of the circuit configuration, the tri-state output is drawn to the supply potential.

The described circuit configuration is well suited to integration in an integrated circuit. In an integrated circuit, the amplifier and the sensor that is connected to the amplifier on the input side can be integrated, as can the output stage. The voltage source for supplying the circuit configuration can be disposed in a central unit, in which the load resistance can also be provided. Furthermore, a converting and evaluating circuit can also be provided in the central unit, which, in a normal operation of the circuit, continually compares the potential at the tri-state output of the output stage to an upper and lower limit, and emits a signal indicating a disturbance when a limit is crossed.

The described circuit configuration has a number of advantages over a circuit configuration whose output stage provides a low-impedance output given the interruption of an operating-current supply of the circuit. Self-conducting transistor structures are usually required therein, which are not provided in the majority of known manufacturing processes for semiconductor circuits and therefore require additional implantation steps. In contrast, in the present circuit configuration, self-blocking transistors can be utilized in the output stage, which are usually present in BiCMOS or CMOS processes.

In the event of a failure, a high-impedance output of the output stage makes it possible to better differentiate a failure state from the normal operating state. Furthermore, self-blocking transistors do not lead to a transient pulse when the circuit configuration is powered up. Beyond this, the current consumption of the circuit in the event of failure is relatively small.

When the load resistance is interposed between the supply potential terminal and the tri-state output, the potential at the tri-state output is equal to the supply potential given the interruption either of the line connecting the voltage source and the supply potential terminal or of the line connecting the reference potential terminal and the supply voltage source, or when both lines are interrupted. If, on the other hand, the load resistance is connected between the tri-state output and the reference potential terminal, then the potential at the tri-state output is equal to the reference potential, i.e. zero volts, regardless of the load instance. Thus, only a comparator is needed in the evaluation circuit in order to be able to detect a disturbance such as an interruption of a supply line, which saves additional costs. In addition, the present circuit can easily be built to be secure against mispoling; i.e. in such a way that the circuit configuration cannot be damaged by confusing a supply potential terminal with the tri-state output or the reference potential terminal with the tri-state output and/or confusing the reference and supply voltage terminals.

The tri-state output can provide a measuring signal, for instance the output signal of a sensor, at the output of the output stage as an analog signal.

In order to guarantee that only potential values below a maximum value and above a minimum value arise at the tri-state output during normal operation, a switching stage can be provided, which guarantees that the potential at the tri-state output is within predefined limits during normal operation. If an evaluation circuit nevertheless detects a crossing of the upper or lower potential limit, then this is an unambiguous indication that a line break or interruption of the operating-current supply of the circuit configuration has occurred.

In a preferred embodiment of the invention, a pair of complementary blocking transistors is provided in the output stage as the switch, a first of which is interposed with its controlled path between the first output transistor and the tri-state output, and the second of which is interposed with its controlled path between the tri-state output and the second output transistor. Charge pump circuits are provided, which are connected on the input side to supply and reference potential terminals and on the output side to the control inputs of the blocking transistors. The blocking transistors are low-impedance conductive in the normal mode owing to the charge pump circuits. To accomplish this, the charge pump circuit of the first blocking transistor can provide a voltage at its output which is 3 volts over the supply potential, and the charge pump circuit connected to the second blocking transistor can provide a potential value at its output which is 3 volts smaller than the reference potential. But if the supply voltage, i.e. the operating-current supply of the circuit configuration, is interrupted, the charge pump circuits as well are no longer powered on the input side, so that the two blocking transistors block; i.e. their controlled systems are high-impedance. A tri-state output can be thereby achieved whose high-impedance state occurs in the range of several giga ohms. This guarantees that in the event of a failure the tri-state output assumes a potential that is very close to the reference potential or the supply potential, regardless of how the load resistance is connected.

Accordingly, with the described circuit configuration a reliable detection of a failure such as a line break is possible.

The charge pump circuits are intended to provide a potential on the output side in a normal operation whose magnitude exceeds the respectively allocated supply potential by at least a few transistor threshold voltages—provided that the blocking transistors are constructed as self-conducting transistors. The first charge pump circuit is intended to provide a potential which exceeds the potential made available at the supply potential terminal by several threshold voltages, and the second charge pump circuit is intended to provide a potential on the output side which exceeds the potential at the reference potential terminal by several threshold voltages.

In another preferred embodiment of the invention, the blocking transistors are self-blocking MOS transistors.

To the extent that the circuit is realized with blocking transistors that include troughs, the troughs of the blocking transistors are preferably not resistively connected to the tri-state output.

In another preferred embodiment of the invention, the first blocking transistor is an NMOS transistor, and the second blocking transistor is a PMOS transistor. The first blocking transistor can be constructed as an NMOS transistor whose gate terminal is raised above a positive supply potential in the normal operation of the circuit with the charge pump circuit. The second blocking transistor can be a PMOS transistor whose gate terminal receives a provided potential below the reference potential during normal operation with a charge pump circuit.

In another preferred embodiment of the invention, the voltage source is an external voltage source which is connected to the supply and reference potential terminals. The voltage source can be provided in a central unit, which may include a load resistance as well as a converting and evaluating circuit. A number of circuit configurations with an integrated amplifier and output stage can be connected to the central unit over respective long lines.

In another preferred embodiment of the invention, an external electrical load is provided, which is connected via one terminal to the tri-state output and via a second terminal to the supply or reference potential terminal. The external electrical load can be connected via the additional terminal directly to the voltage source that supplies the circuit configuration with operating current.

In another advantageous embodiment of the invention, a converting and evaluating circuit is provided, which is connected to the tri-state output on the one hand and to the reference potential terminal on the other hand. The converting and evaluating circuit is connected to the supply potential terminal for referencing and monitors the potential at the tri-state output as to whether it is in a range which is permissible in a normal operation. The range that is permissible during normal operation can be defined by upper and lower voltage limits. The comparison of the signal provided at the tri-state output to the range limits defining the permissible range during normal operation can be accomplished by a comparator that is provided in the converting and evaluating circuit.

In another advantageous embodiment of the invention, the first output transistor includes a PMOS or pnp transistor, and the second output transistor includes an NMOS or npn transistor. IQ Care must be taken that neither an n-trough in which the self-blocking PMOS transistor is formed nor a p-trough in which the self-blocking NMOS transistor is formed is connected to the tri-state output.

In another preferred embodiment of the invention, the output stage is constructed as a circuit that is integrated in a p-doped substrate. The reference potential terminal can be connected to the p-substrate, particularly to a p-substrate terminal. The integrated circuit can be produced in a true two-trough procedure.

In another preferred embodiment, the output stage is constructed as a circuit that is integrated in an n-doped substrate. An n-substrate terminal can be connected to the supply potential terminal. The integrated circuit can be produced in a true two-trough procedure.

In another preferred embodiment of the invention, a high-impedance resistance is provided, which is interposed between the supply potential terminal and the reference potential terminal. Such a high-impedance resistance, which can equal one mega ohm, for instance, is customarily present in integrated CMOS or BiCMOS circuits anyway. What is important is that this resistance have a significantly greater conductivity than that of a blocking pn-junction that is formed parallel thereto. The additional high-impedance resistance improves the high-impedance character of the tri-state output in the event of a failure, particularly at high temperatures. The high-impedance resistance can be constructed as a self-conducting transistor.

In another preferred embodiment of the present invention, the total effective electrical resistance between the supply potential terminal and the reference potential terminal equals 1 mega ohm. If the circuit as a whole is built in CMOS circuitry, an additional resistance, preferably of 1 mega ohm, can be inserted between the supply potential and reference potential terminals, because in this case a cross-current due to parasitic effects will not flow anyway. This improves the reliability of the circuit.

Other features which are considered as characteristic for the invention are set forth in the appended claims.

Although the invention is illustrated and described herein as embodied in a circuit configuration with an integrated amplifier, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
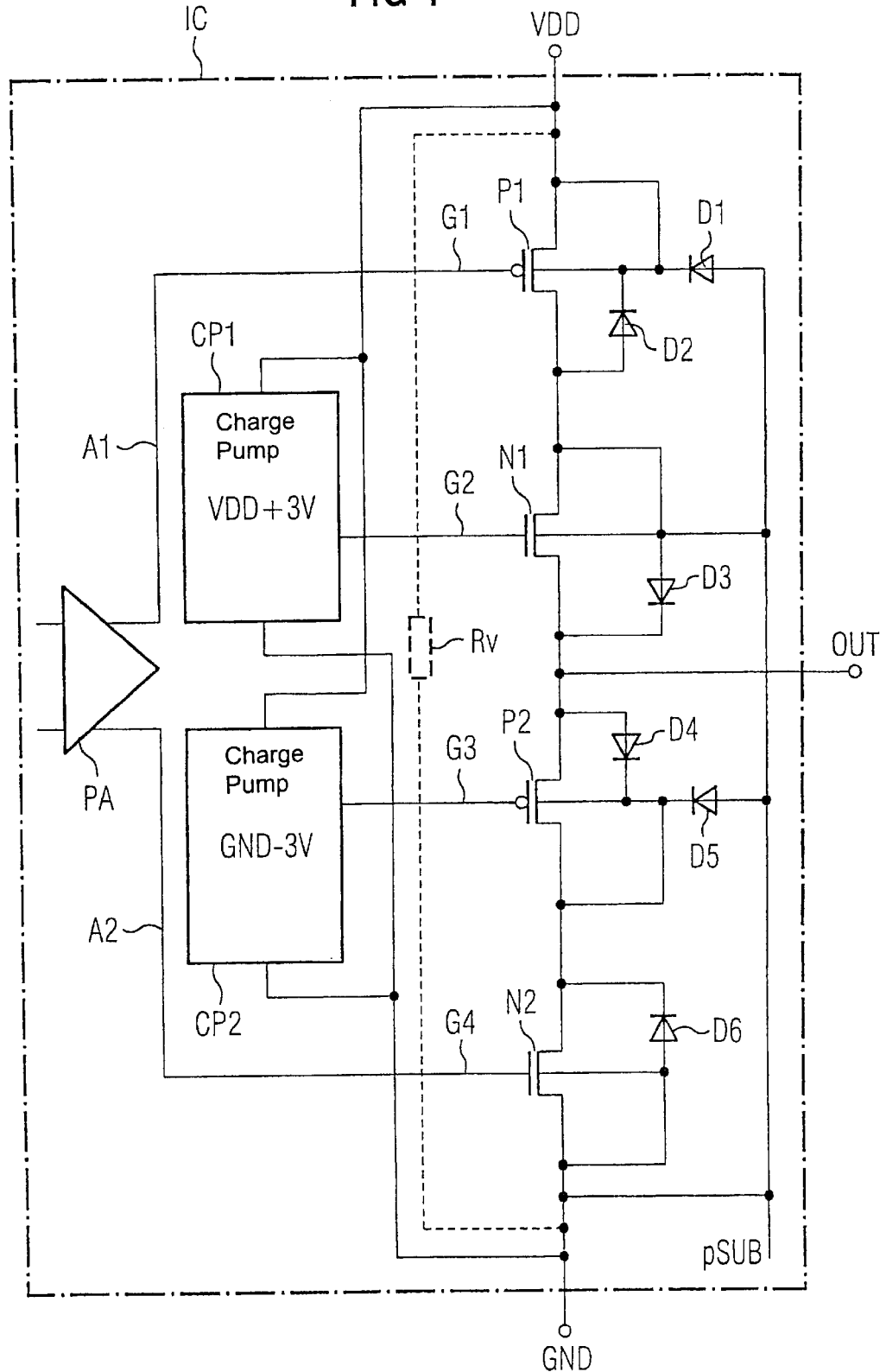
FIG. 1 is a block circuit diagram of a first exemplifying embodiment of a circuit configuration on a p-substrate according to the invention.

Referring now to the figures of the drawing in detail and first, particularly, to FIG. 1 thereof, there is shown a circuit configuration with an amplifier PA and an output stage which are integrated in an integrated circuit IC. The integrated circuit IC contains a supply potential terminal VDD for its operating voltage supply and a reference potential terminal GND. On an output side a tri-state output OUT is provided. The integrated circuit IC is integrated on a p-substrate pSUB.

On an input side of the symmetrically constructed amplifier PA, a non-illustrated sensor is connected, which feeds an analog measuring signal to the amplifier PA. An output A1, A2 of the amplifier PA is constructed as a symmetrical output, with one output terminal A1 being connected to a gate terminal G1 of a first output transistor P1 and another output terminal A2 of the amplifier PA being connected to a gate terminal G4 of a second output transistor N2. A controlled path of the first output transistor P1 is connected to the supply potential terminal VDD via one terminal and to a controlled path of a first blocking transistor N1 via another terminal. The second output transistor N2 is connected via its controlled path to the reference potential terminal GND on the one hand and to a terminal of a controlled path of a second blocking transistor P2 on the other hand. The blocking transistors N1, P2 are directly connected to each other via a respective terminal of their controlled paths, forming the tri-state output OUT at the junction. A respective charge pump circuit CP1, CP2 is connected to each of the gate terminals G2, G3 of the blocking transistors N1, P2. For their own current supply, the charge pump circuits CP1, CP2 are each connected to the reference and supply potential terminals GND, VDD. Between the supply potential terminal VDD and the reference potential terminal GND a resistance RV is provided, which can be formed at least partly from parasitic resistances of the circuit, and which equals 1 mega ohm overall.

During a normal operating state, the charge pump circuits COP, CP2 deliver a potential on an output side, the effect of which is that the self-blocking blocking transistors N1, P2 have a low-impedance conductivity between the terminals of their controlled paths. To accomplish this, a potential that exceeds the supply potential by 3 volts is connected to the gate terminal G2 of the first blocking transistor N1. A potential that is 3 volts under the reference potential is provided by the charge pump circuit CP2 at the gate terminal G3 of the second blocking transistor P2.

During normal operation of the circuit, a potential between an upper and lower limit is provided at the tri-state output OUT via the complementary output transistors P1, N2. An analog output signal or a digital output signal can be provided at the tri-state output, for instance an amplified output signal that is delivered by a sensor.

Bipolar transistors can be provided instead of the output transistors P1, N2.

To improve the voltage stability, several transistors whose controlled paths are connected in series can be provided instead of the output transistors P1, N2. To accomplish this, the connected switches as well as possible driver circuits of the switches can be adapted to the respective requirements.

The voltage terminals, i.e. the supply voltage terminal VDD and the reference potential terminal GND of the circuit configuration, can be connected to an external voltage source. If either the supply potential feed to supply potential terminal VDD or the reference potential feed to reference potential terminal GND is interrupted, the described circuit configuration sets the tri-state output OUT to a reference potential or a supply potential in dependence upon whether an electrical load which is connected to the tri-state output OUT is switched to the supply potential or the reference potential. In any case—i.e. regardless of how the load is disposed and which of the supply lines breaks—the tri-state output OUT is in a high-impedance mode, because the self-blocking transistors N1 and P2 block. In the event of any of the described failures or load instances, or any combination thereof, a converting and evaluating circuit A/D that is connected to the tri-state output OUT can easily detect the presence of the disturbance. The operational reliability is thus maintained. If a sensor is connected to the amplifier PA on the input side, for example, the described circuit effectively precludes the possibility that a signal which is made available at the tri-state output OUT could be interpreted as a faulty measuring signal in the event of a supply line break.

Diodes D1 to D6 at the transistors P1, N1, P2, N2 are only parasitic diodes, or rather parasitic PN junctions of the transistors, which are drawn separately for better understanding. Care must be taken that neither the p-trough of the NMOS transistor N1 nor the n-trough of the NMOS transistor N2 has a resistively conductive connection to the tri-state output OUT. But it is provided that the p-substrate terminal pSUB and the reference potential terminal GND be connected to each other.

Figure 2:
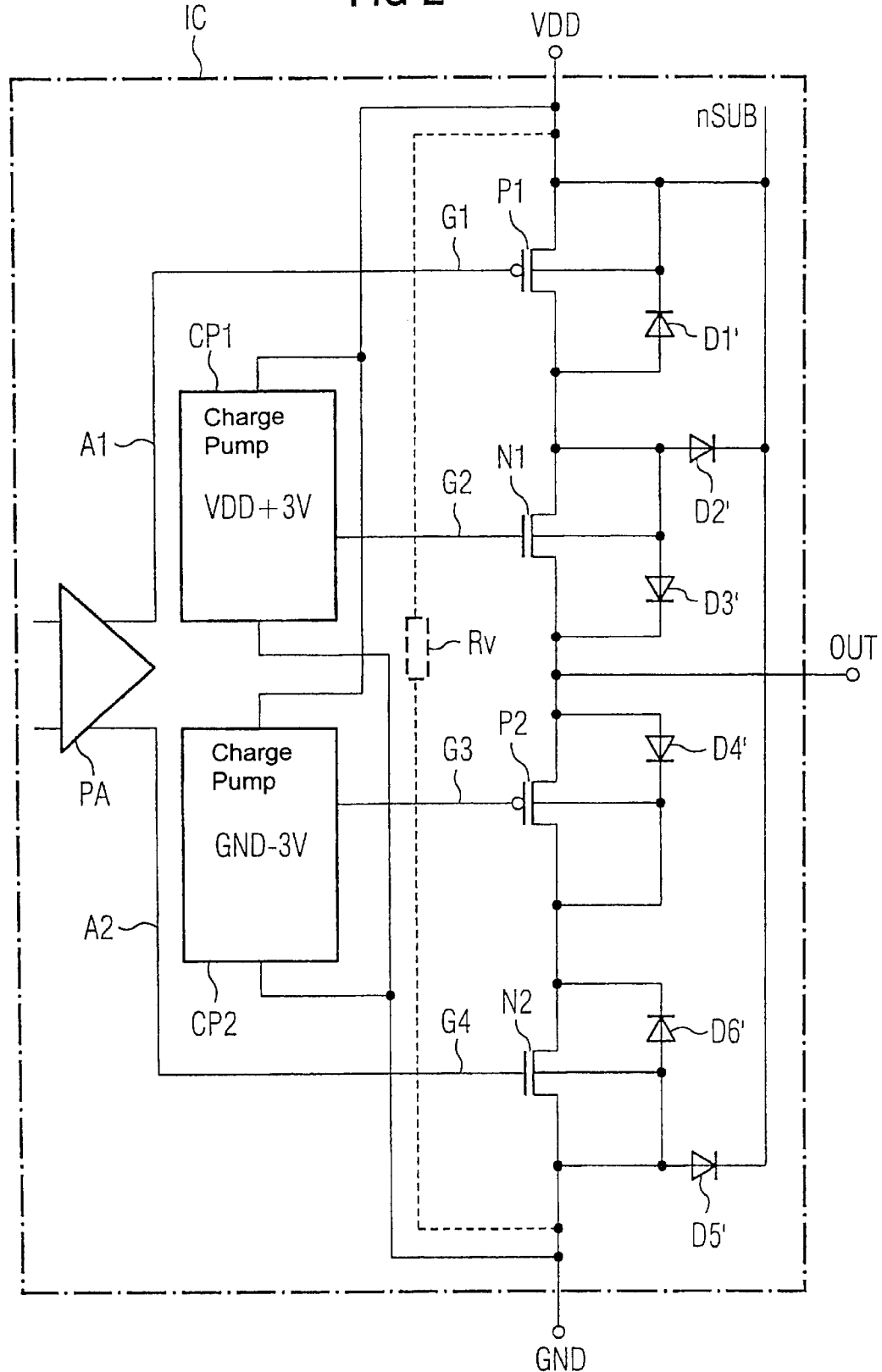
FIG. 2 is block circuit diagram of a second exemplifying embodiment of the present invention on an n-substrate.

FIG. 2 represents another exemplifying embodiment of the circuit configuration according to the invention, which differs from the circuit represented in FIG. 1 only in that the integrated circuit IC which contains the amplifier PA and the output stage is integrated not on a p-doped substrate but on an n-doped substrate nSUB. Here, care must be taken that an n-substrate terminal nSUB is connected not to the reference potential terminal GND but to the supply potential terminal VDD. By virtue of the substrate that is used, which is of a different dopant type in FIG. 2 than in FIG. 1, different parasitic diodes D1' to D6' emerge. The circuit configuration represented in FIG. 2 thus has the same advantages as the configuration represented in FIG. 1.

Figure 3:
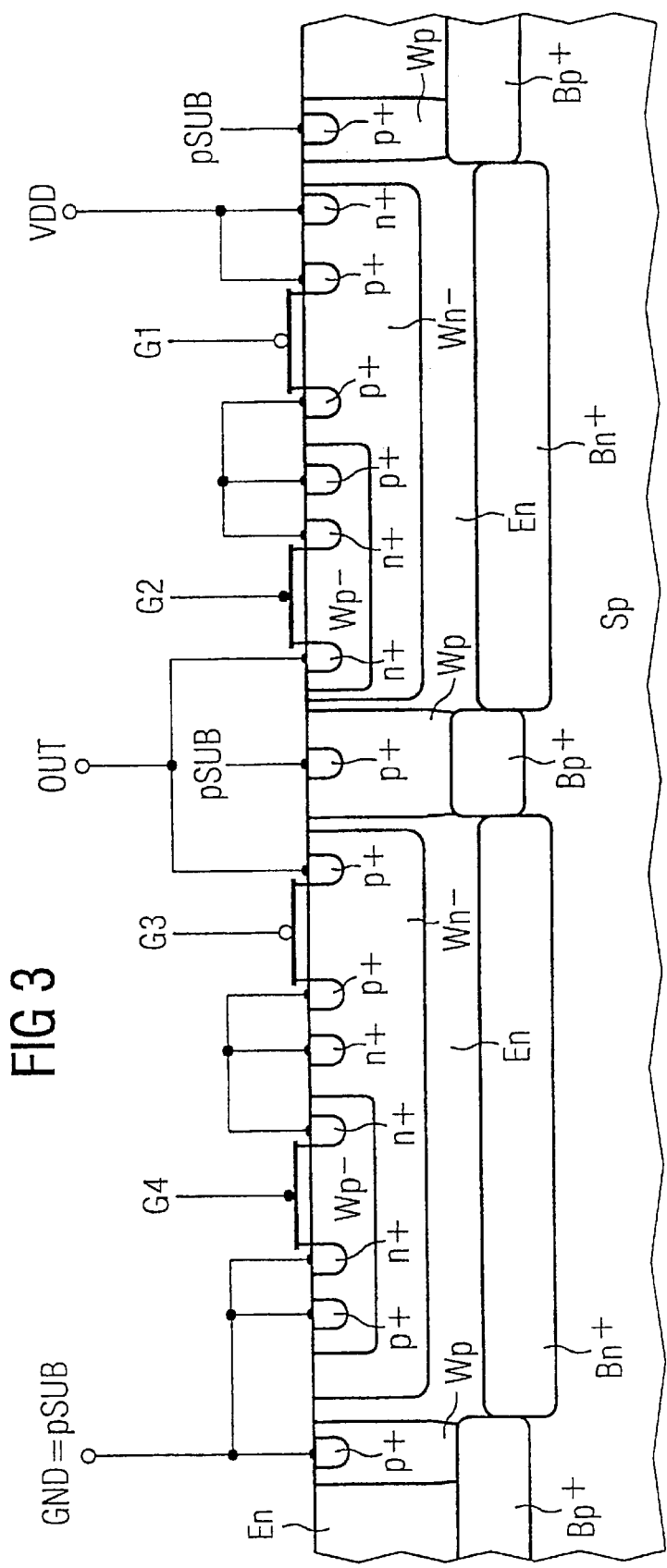
FIG. 3 is a diagrammatic, cross-sectional view through a layout of the circuit represented in the block diagram in FIG. 1.

FIG. 3 represents a cross-section through a possible layout for realizing the circuit shown in FIG. 1. The circuit is integrated on a p-doped substrate Sp. Gate terminals G1, G2, G3, G4 of the blocking and output transistors are clearly visible, as well as the tri-state output OUT, the supply potential terminal VDD and the reference potential terminal GND, which is simultaneously the substrate terminal of the p-doped substrate. The substrate terminals pSUB are separately drawn for better survey ability but are actually all connected to one another. The layout represented in FIG. 3 is constructed in BiCMOS technology. The first output transistor P1 with the gate terminal G1 is constructed as a p-channel transistor with two $p^+$-doped zones as source/drain zones formed in an $n^-$-doped trough or well Wn–. The adjoining first blocking transistor N1 with the gate terminal G2 is aft constructed as an n-channel transistor with two $n^+$-doped zones as source/drain zones and formed in a p-doped trough or well $Wp^-$. The p-trough $Wp^-$ is surrounded by the n-trough $Wn^-$.

In a complementary fashion, the second blocking transistor P2 with the gate terminal G3 is created in the n-doped trough $Wn^-$ with $p^+$-doped source/drain zones. The second output transistor N2 with gate terminal G4 is realized in a p-trough $Wp^-$ with $n^+$-doped source/drain zones. Interposed between the two n-doped troughs $Wn^-$ for insulation purposes is a p-doped trough Wp, which is provided with the substrate terminal pSUB. Additional cross-sections such as this through the p-troughs Wp that insulate the n-troughs are situated on either side of the n-doped troughs $Wn^-$. N-doped buried layers $Bn^+$ are provided between the p-doped substrate Sp and the n-doped troughs $Wn^-$. Conversely, p-doped buried layers $Bp^+$ are provided beneath the insulating p-doped troughs Wp. An epitaxy layer En is grown over the buried layers $Bn^+$, $Bp^+$.

The layout according to FIG. 3 is an example of a realization of the integrated circuit IC from FIG. 1. Instead, the integrated circuit IC from FIG. 1 could also be realized in a true two-trough CMOS technology, as described below in the case of an n-doped substrate.

Figure 4:
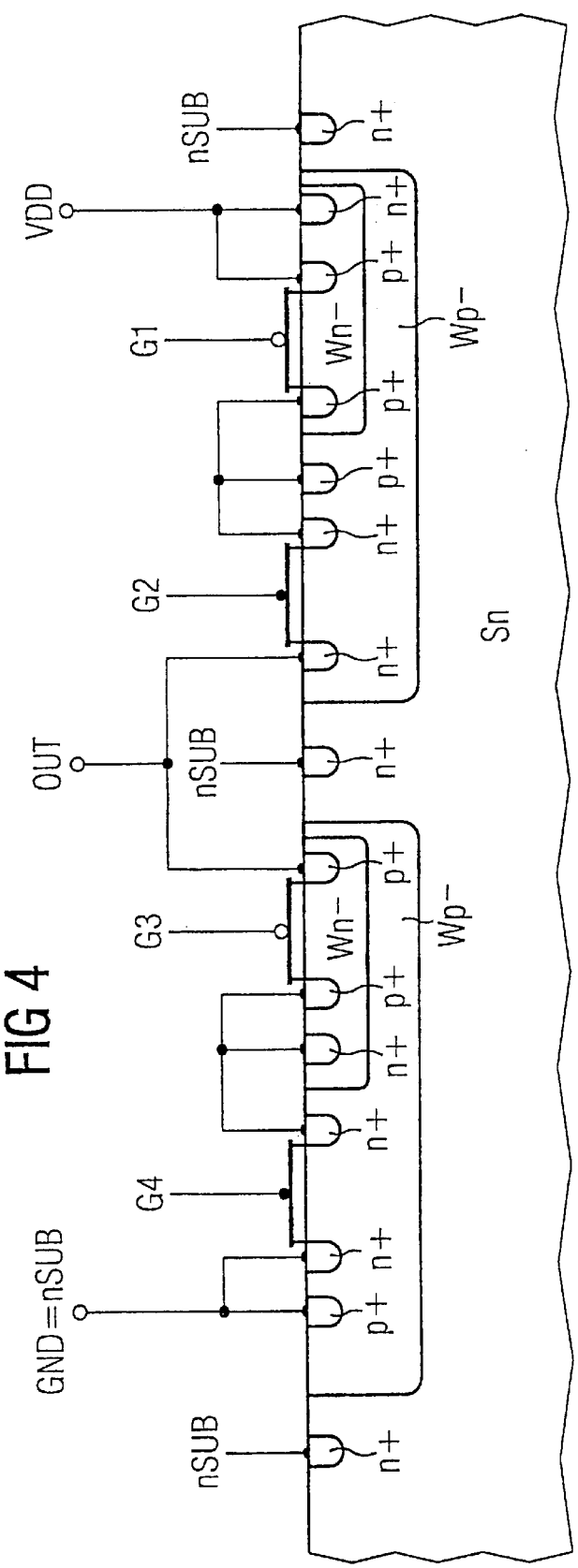
FIG. 4 is a diagrammatic, cross-sectional view of a layout of the block circuit diagram shown in FIG. 2.

FIG. 4 represents a cross-section of a layout of the output stage of the integrated circuit IC shown in FIG. 2. The layout is constructed in a true two-trough CMOS technology. First the output transistor P1 with the gate terminal G1 and the second blocking transistor P2 with the gate terminal G3 are each realized in the n-doped trough $Wn^-$ with the $p^+$-doped source/drain regions $p^+$. The n-doped troughs $Wn^-$ are surrounded by the respective p-doped troughs $Wp^-$, in which the respective NMOS transistors N1, N2 are formed. The NMOS transistors, namely the first blocking transistor N1 with the gate terminal G2 and the second output transistor N2 with the gate terminal G4, have $n^+$-doped zones as respective source/drain terminals. The two p-troughs $Wp^-$ are disposed in a common n-doped substrate Sn. The circuit terminals including the tri-state output OUT, the substrate terminal SUB, the reference potential terminal GND, and the supply potential terminal VDD correspond to the terminals in FIG. 2 that are assigned the same reference characters. Care must be taken here that teh substrate terminal nSUB and the reference potential terminal GND are galvanically connected to each other. Of course, the circuit configuration of FIG. 2 can also be realized in BiCMOS technology as represented in FIG. 3 for a p-substrate, instead of the described two-trough technology.

In the first place, the described exemplifying embodiments serve as protection against the mispoling of the terminals, i.e. the reference potential terminal GND, the supply potential terminal VDD, and the tri-state output OUT. Furthermore, they create the ability to reliably detect errors given interruption of the supply voltage. On the other hand, the circuit can be realized for a small production outlay, has no transient pulse upon activation of the circuit, and saves electricity even in the event of a failure.

Figure 5:
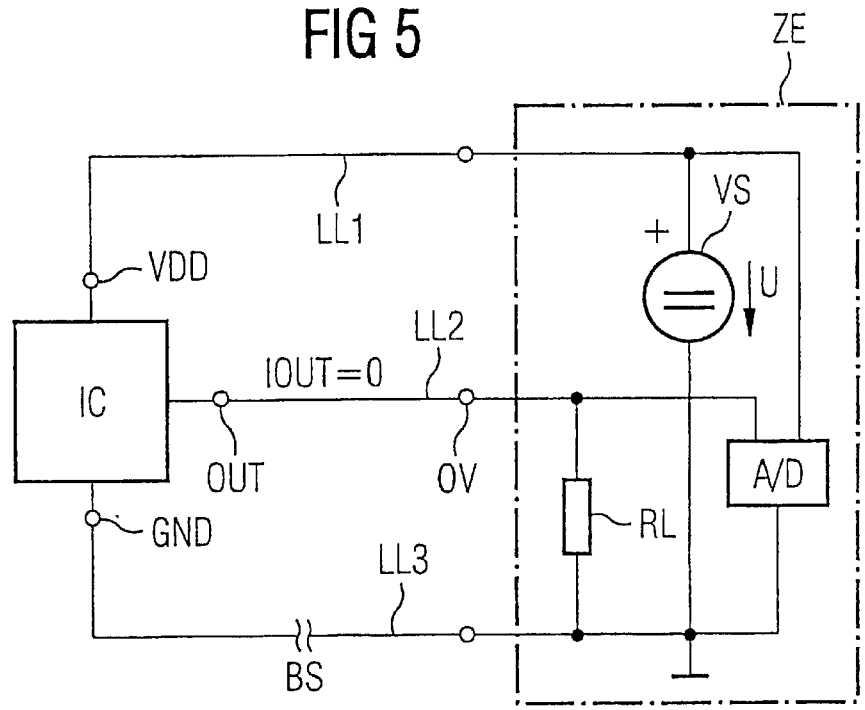
FIG. 5 is a circuit diagram of the circuit configuration as represented in FIG. 1 or 2, which is connected to a central unit, in a first load instance.
Figure 6:
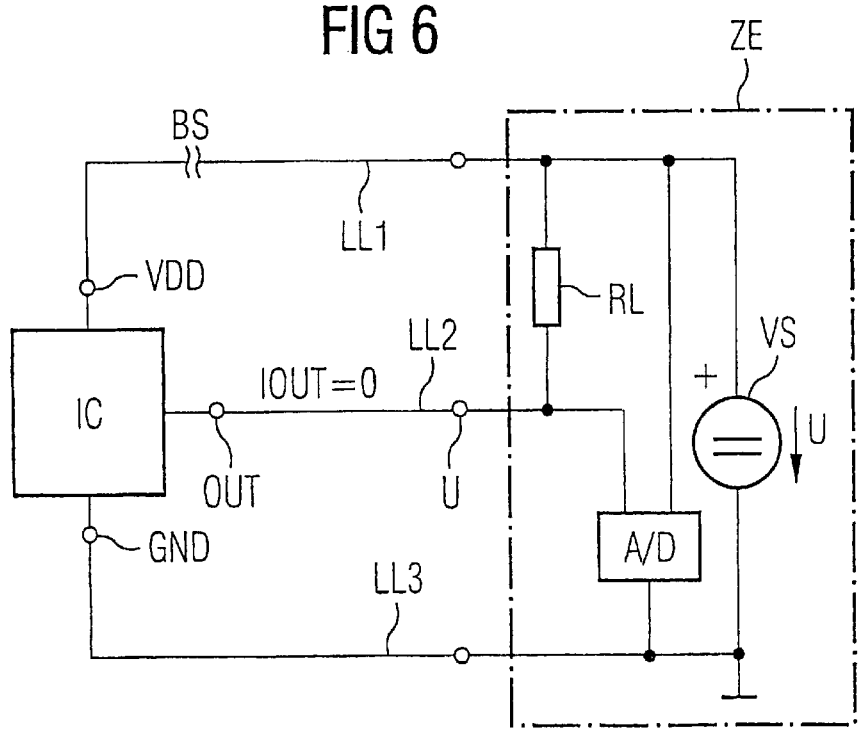
FIG. 6 is a circuit diagram of the circuit configuration as represented in FIG. 1 or 2, which is connected to the central unit, in a second load instance.

FIGS. 5 and 6 represent the integrated circuit IC shown in FIGS. 1 and 2 with the reference potential terminal GND, the tri-state output OUT, and the supply potential terminal VDD.

The supply terminals VDD, GND are each connected over a long line LL1, LL3 to an external supply voltage VS which is disposed in a central unit ZE. An electrical load RL, which is disposed in the central unit ZE, and a converting and evaluating circuit A/D are also connected to the tri-state output OUT. Like the load resistance RL, the converting and evaluating circuit A/D is also disposed in the central unit ZE. The converting and evaluating circuit A/D is connected to the tri-state output OUT and to reference potential terminal GND, and is also connected to the supply potential terminal VDD for referencing.

FIGS. 5 and 6 differ only with respect to the load instance. Whereas the electrical load RL in FIG. 5 is provided as what is known as a pull-down load, i.e. it is between the tri-state output OUT and reference potential terminal GND, in FIG. 6 it is a pull-up load, i.e. it is connected between the tri-state output OUT and the supply potential terminal VDD.

Depending on the load instance, an interruption BS of one or both supply lines LL1, LL3 causes the tri-state output OUT to have a high-impedance, and either the reference potential 0V or the supply potential U is made available at the tri-state output OUT. This makes it possible to easily detect a failure by the converting and evaluating circuit A/D, which continually compares the voltage at the output OUT, which is supplied over the line LL2, to upper and lower limit values which are maintained during normal operation, as already described above.

The present circuit configuration is provided particularly for application in sensors with an analog output signal in which a high operational reliability is required and a misinterpretation of measuring results given disturbances must be absolutely avoided.

Besides the described failures, which are characterized by the occurrence of the break BS in one supply line LL1, LL3 or both, in modifications of the invention the tri-state output OUT could also be high-impedance when the output voltages which are provided by the charge pump circuits CP1, CP2 are above or below specific definable limits or when a failure condition is generally detected by the integrated circuit IC. The operational reliability of the circuit can be further improved by simple steps in this manner.

In alternative simplified embodiments of the invention, particularly when only pull-down load resistances occur, the blocking transistor N1 can be omitted. Likewise, particularly when only pull-up load resistances occur, the blocking transistor P2 can be omitted.

We claim:

1. A circuit configuration, comprising:

an integrated amplifier with a symmetrical amplifier output;

a supply potential terminal to be coupled to a voltage source for supplying an operating current;

a reference potential terminal to be coupled to the voltage source;

a tri-state output; and an output stage having a pair of complementary output transistors with control inputs connected to said symmetrical amplifier output, said pair of complementary output transistors includes a first output transistor having a controlled path coupling said supply potential terminal to said tri-state output, and a second output transistor having a controlled path coupling said tri-state output to said reference potential terminal, said output stage further having switches coupling said first and second output transistors with said tri-state output so that said tri-state output is put into a high-impedance state given an interruption of the operating current.

2. The circuit configuration according to claim 1, wherein said switches includes a pair of complementary blocking transistors including a first blocking transistor having a controlled path connected between said first output transistor and said tri-state output, and a second blocking transistor having a controlled path connected between said tri-state output and said second output transistor, said first and second blocking transistors having control inputs; and including charge pump circuits connected between said supply potential terminal and said reference potential terminal and having outputs connected to said control inputs of said first and second blocking transistors.

3. The circuit configuration according to claim 2, wherein said first and second blocking transistors are self-blocking MOS transistors.

4. The circuit configuration according to claim 2, wherein said first blocking transistor is an NMOS transistor, and said second blocking transistor is a PMOS transistor.

5. The circuit configuration according to claim 1, wherein the voltage source is an external voltage source which is connected to said supply and reference potential terminals.

6. The circuit configuration according to claim 1, including an external electrical load having a first terminal connected to said tri-state output and a second terminal connected to one of said supply potential terminal and said reference potential terminal.

7. The circuit configuration according to claim 1, including a converting and evaluating circuit having a first terminal connected to said tri-state output, a second terminal connected to said reference potential terminal, and a third terminal connected to said supply potential terminal for referencing, said converting and evaluating circuit monitoring a potential at said tri-state output as to whether the potential is within a range which is permissible during normal operation.

8. The circuit configuration according to claim 1, wherein said first output transistor includes a transistor selected from the group consisting of PMOS transistors and PNP transistors, and said second output transistor includes a transistor selected from the group consisting of NMOS transistors and NPN transistors.

9. The circuit configuration according to claim 1, wherein said output stage is integrated in a p-doped substrate.

10. The circuit configuration according to claim 1, wherein said output stage is integrated in an n-doped substrate.

11. The circuit configuration according to claim 1, including a resistance having a first terminal connected to said reference potential terminal and a second terminal connected to said supply potential terminal.

12. The circuit configuration according to claim 11, wherein said resistance is one mega ohm.

* * * * *